US005572542A

United States Patent [19]
Dixon

[11] Patent Number: 5,572,542
[45] Date of Patent: Nov. 5, 1996

[54] TECHNIQUE FOR LOCKING AN EXTERNAL CAVITY LARGE-AREA LASER DIODE TO A PASSIVE OPTICAL CAVITY

[75] Inventor: George J. Dixon, Indian Harbor Beach, Fla.

[73] Assignee: AMOCO Corporation, Chicago, Ill.

[21] Appl. No.: 421,508

[22] Filed: Apr. 13, 1995

[51] Int. Cl.$^6$ ..................................................... H01S 3/08
[52] U.S. Cl. ............................... 372/92; 372/32; 372/94; 372/98
[58] Field of Search .............................. 372/32, 39, 94, 372/29, 105, 92, 98, 97, 93, 102

[56] References Cited

U.S. PATENT DOCUMENTS

| | | |
|---|---|---|
| 4,879,722 | 11/1989 | Dixon et al. . |
| 4,884,276 | 11/1989 | Dixon et al. . |
| 4,907,238 | 3/1990 | Chun et al. . |
| 5,027,361 | 6/1991 | Kozlovsky et al. . |
| 5,038,352 | 8/1991 | Lenth et al. . |
| 5,050,179 | 9/1991 | Mooradian . |
| 5,060,233 | 10/1991 | Harder et al. . |
| 5,084,840 | 1/1992 | Kozlovsky et al. . |
| 5,095,491 | 3/1992 | Kozlovsky et al. . |
| 5,142,542 | 8/1992 | Dixon . |
| 5,351,121 | 9/1994 | Baer et al. . |
| 5,432,610 | 7/1995 | King et al. . |

OTHER PUBLICATIONS

Kozlovsky et al., "Blue Light Generation By Resonator–Enhanced Frequency Doubling Of An Extended–Cavity Diode Laser", *Appl. Phys. Lett.* 65(5), Aug. 1, 1994.

Armstrong et al., "Interactions Between Light Waves In A Nonlinear Dielectric," *Phys. Rev.*, 127 (6), 1918–1938 (1961). Date Not Avail.

Ashkin et al., "Resonant Optical Second Harmonic Generation and Mixing," *IEEE J. Quantum Electron.*, QE–2 (6), 109–123 (1966). Date Not Avail.

Baumert et al., "Nonlinear Optical Effects In KNbO$_3$ Crystals at Al$_x$Ga$_{1-x}$As, Dye, Ruby and ND:YAG Laser Wavelengths," *SPIE (ECOOSA)*, 492 (Amsterdam) 374–385 (1984). Date Not Avail.

Chang–Hasnain, "Characteristics of the off–centered apertured mirror external cavity laser array," *Appl. Phys. Lett.*, 54 (6), 484–486 (1986). Data Not Avail.

Chang–Hasnain et al., "Diffraction–limited emission from a diode laser array in an apertured graded–index lens external cavity," *Appl. Phys. Lett.*, 49 (11), 614–616 (1986) Date Not Avail.

Chang–Hasnain et al., "High power with high efficiency in a narrow single–lobed beam from a diode laser array in an external cavity," *Appl. Phys. Lett.*, 50 (21), 1465–1467 (1987). Date Not Avail.

Cuthbertson et al., "Pump–resonant excitation of the 946–nm Nd:YAG laser," *Optics Lett.*, 16(6), 396–398 (1991). Date Not Avail.

Dahmani et al., "Frequency stabilization of semiconductor lasers by resonant optical feedback," *Optics Lett.*, 12 (11), 876–878 (1987).

(List continued on next page.)

Primary Examiner—Leon Scott, Jr.
Attorney, Agent, or Firm—Leydig, Voit & Mayer, Ltd.

[57] ABSTRACT

A large-area semiconductor laser diode in an extended laser cavity is locked by a passive optical coupling to a passive resonator for frequency and amplitude stable buildup of an intracavity field in the passive resonator. The large-area laser diode may be a broad-area diode, a phased array, or a tapered amplifier. The extended laser cavity may be a linear cavity, or a ring cavity in either a double-pass or a single-pass configuration. Spatial beam cleanup and passive locking are simultaneously achieved. The concentrated power in the passive resonator is useful for accomplishing second harmonic generation, frequency summing and the like at high levels of efficiency and at low noise levels resulting from the frequency and amplitude stability within the passive resonator.

25 Claims, 10 Drawing Sheets

OTHER PUBLICATIONS

Dixon et al., "432-nm source based on efficient second-harmonic generation of GaAlAs diode-laser radiation in a self-locking external resonant cavity," *Optics Lett.*, 14 (14), 731–733 (1989).

Fork et al., "A scanning spherical mirror interferometer for spectral analysis of laser radiation," *Appl. Optics*, 3 (12), 1471–1484 (1964).

Gerstenberger et al., "Efficient second-harmonic conversion of cw single-frequency Nd:YAG laser light by frequency locking to a monolithic ring frequency doubler," *Optics Lett.*, 16 (13), 992–994 (1991).

Goldberg et al., "Blue light generation by frequency doubling of AlGaAs broad area amplifier emissiion," *Appl. Phys. Lett.*, 60 (9), 1037–1039 (1992).

Goldberg et al., "Broad-area high-power semiconductor optical amplifier,"*Appl. Phys. Lett.*, 58 (13), 1357–1359 (1991).

Goldberg et al., "Diffraction-limited broad stripe laser emission in an external resonator," presented at *CLEO '89*, FL6, 422–425 (1989).

Goldberg et al., "Efficient generation at 421 nm by resonantly enhanced doubling of GaAlAs laser diode array emission," *Appl. Phys. Lett.*, 55 (3), 218–220 (1989).

Goldberg et al., "Injection locking characteristics of a 1 W broad stipe laser diode," *Appl. Phys. Lett.*, 53 (20), 1900–1902 (1988).

Goldberg et al., "21 W broad area near-diffraction-limited semiconductor amplifier," *Appl. Phys. Lett.*, 61 (6), 633–635 (1992).

Goldberg et al., "12 W Broad Area Semiconductor Amplifier With Diffraction Limited Optical Output," *Electronics Lett.*, 27 (11), 927–929 (1991).

Goldberg et al., "Single lobe operation of a 40-element laser array in an external ring laser cavity," *Appl. Phys. Lett.*, 51 (12), 871–873 (1987).

Goldberg et al., "3–3 W CW Diffraction Limited Broad Area Semiconductor Amplifier," *Electronics Lett.*, 20 (1992).

Hall et al., "Progress Toward Phase-Stable Optical Frequency Standards," *Journal De Physique*, 42 (12-C8), 59–71 (1981).

Hemmerich et al., "Second-harmonic generation and optical stabilization of a diode laser in an external ring resonator," *Optics Lett.*, 15 (7) 372–374 (1990).

Jundt et al., "69% Efficient continuous-wave second-harmonic generation in lithium-rich lithium niobate," *Optics Lett.*, 16 (23), 1856–1858 (1991).

Kean et al., "Efficient sum-frequency upconversion in a resonantly pumped Nd:YAG laser," *Optics Lett.*, 17 (2), 127–129 (1992).

Kean et al., "Generation of 20 mW of blue laser radiation from a diode-pumped sum-frequency laser," *Appl. Phys. Lett.*, 63 (3), 302–304 (1993).

Kleinman et al., "Infrared Detection by Optical Mixing," *J. Appl. Phys.*, 40 (2), 546–565 (1969).

Kogelnik, "On the Propagation of Gaussian Beams of Light Through Lenslike Media Including those with a Loss of Gain Variation," *Appl. Optics*, 4 (12), 1562–1569 (1965).

Kogelnik et al., "Laser Beams and Resonators," *Appl. Optics*, 5 (10), 1550–1566 (1966).

Kozlovsky et al., "Efficient Second Harmonic Generation of a Diode-Laser-Pumped CW Nd:YAG Laser Using Monolithic MgO:LiNbO$_3$ External Resonant Cavities," *IEEE J. Quantum Electron.*, 24 (6), 913–919 (1988).

Kozlovsky et al., "Generation of 41 mW of blue radiation by frequency doubling of a GaAlAs diode laser," *Appl. Phys. Lett.*, 56 (23), 2291–2292 (1990).

Kozlovsky et al., "Resonator-enhanced frequency doubling in an extended-cavity diode laser," *Digest of the Compact Blue-Green Laser Topical Meeting, Postdeadline Paper Supplement*, PD2/1–PD2/3, (Optical Society of America, Washington, D.C., 1993).

Mehuys et al., "1W CW, Diffraction-Limited, Tunable External-Cavity Semiconductor Laser," *Electronics Lett.*, 29 (14), 1254–1255 (1993).

Mehuys et al., "2-OW CW, Diffraction-Limited Tapered Amplifier With Diode Injection," *Electronics Lett.*, 28 (21), 1944–1945 (1992).

Polzik et al., "Frequency doubling with KNbO$_3$ in an external cavity," *Optics Lett.*, 16 (18), 1400–1402 (1991).

Risk et al., "Efficient generation of blue light by doubly resonant sum-frequency mixing in a monolithic KTP resonator," *Optics Lett.*, 17 (10), 707–708 (1992).

Shang et al., "Narrowband, high power light from diode lasers," *Appl. Optics*, 28 (9), 1618–1623 (1989).

Siegman, "Laser Mirrors and Regenerative Feedback," in *Lasers*, Chapter 11, 408–440 (University Science Books, Mill Valley, CA, 1986).

Siegman, "Stable Two-Mirror Resonators," in *Lasers*, Chapter 19, 761–767 (University Science Books, Mill Valley, CA, 1986).

Tanner et al., "Atomic beam collimation using a laser diode with a self-locking power-buildup cavity," *Optics Lett.*, 13 (5), 357–359 (1988).

Waarts et al., "High-power, cw, diffraction-limited, GaAlAs laser diode array in an external Talbot cavity," *Appl. Phys. Lett.*, 58 (23), 2586–2588 (1991).

Yang et al., "6.5-W, 532-nm radiation by cw resonant external-cavity second-harmonic generation of an 18-W Nd:YAG laser in LiB$_3$O$_5$," *Optics Lett.*, 16 (19), 1493–1495 (1991).

Yaeli et al., "Array mode selection utilizing an external cavity configuration," *Appl. Phys. Lett.*, 47 (2), 89–91 (1985).

TECHNIQUE FOR LOCKING AN EXTERNAL CAVITY LARGE-AREA LASER DIODE TO A PASSIVE OPTICAL CAVITY

FIELD OF THE INVENTION

This invention relates to lasers of the type that employ semiconductor gain elements within a resonant cavity external to the gain element. More particularly, the invention relates to the use of optical feedback into the semiconductor gain element to enhance the coupling of the light from the semiconductor gain element into a passive optical cavity.

BACKGROUND OF THE INVENTION

A laser is a device that has the ability to produce coherent light through the stimulated emission of photons from atoms, molecules or ions of an active medium, which has typically been excited from a ground state to a higher energy level by an input of energy. Such a device contains an optical cavity or resonator that is defined by highly reflective surfaces that form a closed round-trip path for light, and the active medium is contained within the optical cavity.

Laser diodes are the most ubiquitous types of lasers available today. They are compact, rugged and relatively inexpensive, and are therefore potentially useful in many commercial applications. Output powers available from single-mode laser diodes such as single-stripe diodes are as high as several hundred milliwatts (mW). These low power outputs limit their applications. On the other hand, output powers available from semiconductor laser devices with large active areas, such as broad-area laser diodes, phased array diodes, and tapered amplifiers, are on the order of several watts. Because of their relatively large active areas as compared to single-stripe laser diodes, broad-area laser diodes, phased array diodes, tapered amplifiers are hereafter referred to as large-area diodes.

Although large-area diodes are significantly more powerful than single-stripe diodes, in many applications powers much higher than the output powers of large-area diodes are desirable. The generation of blue light through non-linear optical processes is one of such cases. Due to limitations of material technology, laser diodes directly generating visible lights in the range of blue are difficult to make. Non-linear optical processes are practical ways for generating blue lights. For instance, infrared output of a large-area diode laser can be used in a second harmonic generation (SHG) process to produce blue light. Blue light can also be produced by frequency-summing two less energetic lights. The efficiencies of those non-linear optical processes depend strongly on the power of the input light. For example, the conversion efficiency of the second harmonic generation process is proportional to the square of the power of the light to be converted. It is therefore advantageous to be able to concentrate the output of a laser diode to produce a light power that is much higher than the output power of the diode.

One way to concentrate the output power of a laser is to use a passive resonator, which is basically an optical cavity defined by reflective mirrors, to store or concentrate the laser light. Depending on the design of the passive resonator and the optical coupling between the laser and the passive resonator, the power in the passive resonator can be orders of magnitude higher than the direct output power of the diode.

Concentrating the output of a laser diode in a passive resonator cavity can be a difficult process, however. In order to efficiently introduce the output of a semiconductor laser diode into the passive resonator, the output of the laser diode has to be mode-matched to a resonant mode of the passive cavity. For efficient mode-matching, the laser diode has to operate at a single frequency and in a well-defined spatial mode. One example of a design that provides concentrated power in a passive resonator locked to a single-strip diode is described and illustrated in applicant's related U.S. patent application Ser. No. 08/370,508, filed Jan. 9, 1995. Unfortunately, the beams of higher power broad-area and phased array laser diodes are characterized by poor spatial and spectral qualities. Specifically, the output beam of a broad-area or phased array diode is not diffraction limited in the direction parallel to the junction of the diode, and the beam typically includes many different frequencies, which correspond to the different longitudinal modes of the diode resonator.

Although the poor spatial and spectral qualities of the broad-area diode lasers and phased arrays diodes make them unsuitable for many applications, spatial beam cleanup techniques are known for producing near-diffraction-limited beams. In general, the resonant cavity of a broad-area diode laser or laser diode array is extended beyond the output facets of the diode, and spatial beam cleanup is accomplished by placing a spatial filter in the portion of the extended laser cavity outside the semiconductor element. In addition, the circulating field in the extended cavity is incident on the output facet of the gain element at an angle to the normal that is typically between two (2) and five (5) degrees. Both linear and ring architectures for these extended cavities have been reported. U.S. Pat. No. 4,905,252 to Goldberg et al. illustrates an example of such an extended cavity. Other examples can be found in the following references: C. J. Chang-Hasnain, J. Berger, D. R. Scifres, W. Streifer, J. R. Whinnery and A. Dienes, "High Power and High Efficiency In A Narrow Single-Lobed Beam From a Diode Laser Array In An External Cavity," *Applied Phys. Lett.* 50 1465 (1987); L. Goldberg, J. F. Weller, and M. K. Chung, "Diffraction-Limited Broad Stripe Laser Emission In An External Resonator," *Digest of the Conference on Lasers and Electro-Optics* (Optical Society of America, Washington, D.C., 1989), Paper FL6.

Although the beam cleanup techniques described above can be used to obtain single-frequency near-diffraction-limited beams from extended cavity broad-area and phased array diode lasers, difficulties remain in mode-matching the output of the diode laser to the passive resonator. In order to achieve maximum power buildup in a passive optical cavity, the input radiation has to be both spatially and spectrally mode-matched to the resonance of the cavity. Spatial mode-matching generally involves the use of optical elements to adjust the shape and size of the laser output beam to match the fundamental transverse mode of the passive resonator. Spectral mode-matching requires that the frequency of the laser output be matched to a resonant frequency of the passive resonator. If this frequency-matching condition is not satisfied, the laser output that is transmitted into the passive resonator will not be able to build up inside the passive resonator. The frequency mismatch between the laser diode and the passive resonator can be caused by imperfections in a normal operating environment, such as mechanical vibrations, temperature variations, and the like, which are typically called "technical noises." Those technical noises cause changes in the resonant frequencies of the passive resonator and the frequency of the laser diode, thereby affecting the mode-matching between the laser diode and the resonator.

Complex electronic stabilization techniques like Drever-Pound locking are typically used to keep the frequency of a laser diode locked to a resonance mode of a passive resonator. Those techniques are generally called active locking due to their use of active components. Those electronic locking techniques are not satisfactory because they are incapable of maintaining lock for an extended period of time when the laser system is subject to technical noises found in normal operational environments. Their optoelectronic complexities and high costs also make them unsuitable for commercial applications.

SUMMARY OF THE INVENTION

It is the primary aim of the invention to concentrate the output power of a high power semiconductor laser diode, especially a large-area laser diode, into a passive resonator in a manner that maintains both frequency and amplitude stabilities of the concentrated power in the passive resonator.

To that end, it is an object of the invention to spatially and spectrally mode-match the output radiation from a large-area semiconductor gain element to a passive resonator over a range of normal operating conditions, thereby maximizing and stabilizing the concentration of the power from the output beam within the resonator.

It is a further object of the invention to provide an effective method for locking the output frequency of the semiconductor gain element to a resonance frequency of the passive resonator which avoids the use of compensating electronics.

It is a further related object of the invention to provide a solid-state laser that is economic to manufacture while at the same time achieving the foregoing objects and aim.

It is yet another object of the invention to provide a solid-state laser of the foregoing type that is compact and robust, therefore suitable for consumer applications.

Briefly, the foregoing objects are achieved by a solid-state laser having an extended resonant cavity and a large-area gain element, such as a broad-area laser diode, a laser diode array, or a tapered amplifier, as the active medium. The laser can have different laser cavity architectures, such as a linear cavity, a double-pass ring cavity, or a single-pass ring cavity. The laser has a passive resonator in which the circulating laser power is concentrated, and appropriate optics for feeding from the passive cavity back to the active medium a portion of the intracavity power in the passive cavity.

Simultaneous spatial beam cleanup of the output of the large-area diode and frequency locking of the diode to the passive resonator are achieved with the techniques according to the present invention. For beam cleanup, a spatial filter can be incorporated into the extended laser cavity. A separate spatial filter, however, may not be necessary according to the present invention, because the passive resonator can also serve the function of spatial filtering. For frequency locking, the amount of the resonator intracavity power fed back to the laser diode is sufficiently high so as to force the laser diode to operate in a single-frequency mode and to lock the frequency $f_O$ of the laser diode to a resonant frequency $f_R$ of the passive cavity. By maintaining sufficient feedback power over all changes in ambient conditions, frequency locking of the laser diode to the passive cavity is ensured. Appropriate optics and cavity architectures are provided so that the feedback path of the power from the passive resonator to the diode does not go through the passive resonator. This avoids losses caused by passing the feedback power through the passive resonator, thereby allowing more power to be fed back to the gain element.

Because the techniques according the present invention lock a large-area gain element to a passive resonator via totally passive means, no expensive and complex mechanical/electronic setup is needed for actively locking the output of the gain element to the passive resonator. This results in significant savings on costs and part counts, making devices according to the present invention commercially viable.

With the passive locking techniques of the present invention, laser light from a high-power, large-area laser diode can be concentrated in a passive resonator, which can be employed for many applications. For example, non-linear crystals of well-known types can be placed within the passive cavity in order to achieve highly efficient second harmonic generation in a power regime and with frequency and amplitude stability that was heretofore unobtainable. The combination of high power and frequency and amplitude stability is essential for many potential industrial and consumer applications. Due to the effectiveness of the passive locking techniques of the present invention, the concentrated laser power in the passive resonator has low noise levels in the low frequency region and has satisfactory long term stability. The concentrated power can thus be successfully used in many applications which are insensitive to high frequency noises. For example, in the application of video image projection, human eyes are insensitive to noises in the light intensity above approximately 100 hertz. The high output of blue light generated in a second harmonic generation process with a passively locked laser system according to the present invention can be used as one of the primary colors to produce satisfactory projected video images.

While the invention will be described in some detail with reference to alternative preferred embodiments, it should be understood that it is not applicant's intention to limit the invention to such detail and embodiments. On the contrary, it is the applicant's intention to cover all alternatives, modifications and equivalents whether or not they are expressly described which fall within the spirit and scope of the invention as defined by the appended claims.

DETAILED DESCRIPTION OF THE PREFERRED AND ALTERNATIVE EMBODIMENTS

Figure 1:
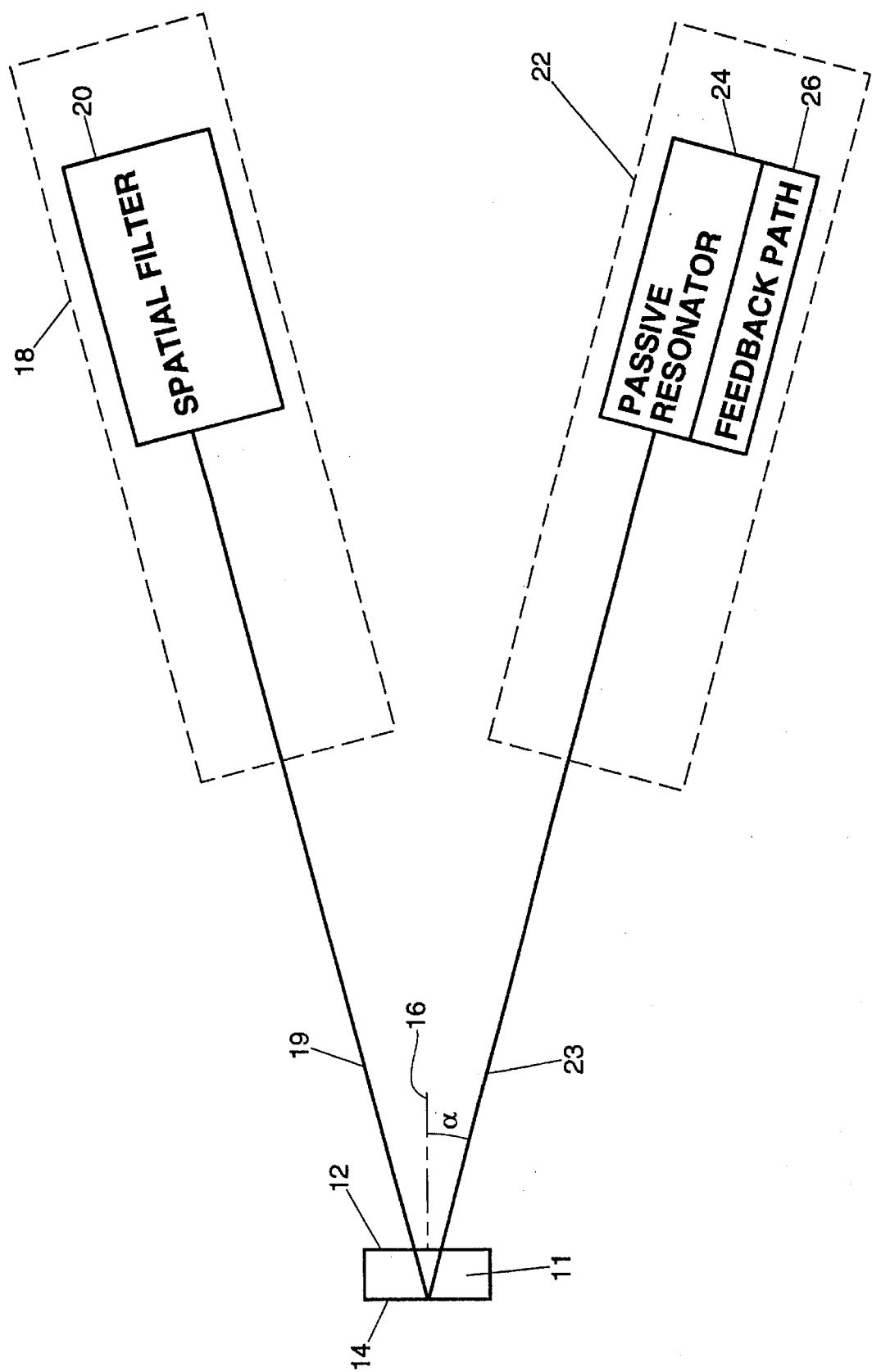
FIG. 1 is a highly schematic diagram illustrating a solid state large-area diode laser according to the invention which utilizes an extended linear cavity which consists of separate spatial cleanup and passive locking arms.

FIG. 1 shows a highly schematic diagram illustrating generally the techniques according to this invention for locking a solid state diode laser with an extended linear laser cavity to a passive resonator. Because FIG. 1 is for illustrating the general concepts according to the present invention, no specific details of the arrangement of optical elements are shown.

The gain element 11 of the laser illustrated in FIG. 1 can be a large-area laser diode having an active area with a generally uniform width, such as a broad-area laser diode or a phased array diode. Those types of semiconductor laser diodes with a generally uniform active area width are hereafter referred to as non-taper laser diodes, in order to distinguish them from laser diodes which have an active area width that varies significantly between the two end facets, such as a tapered amplifier.

The extended linear optical cavity of the laser can be viewed as comprising two arms: a spatial beam cleanup arm 18 and a passive locking arm 22. The spatial beam cleanup arm 18 includes a spatial beam filter 20 which filters out the undesirable spatial component of the beam from the laser diode. The spatial filter 20 can be viewed as a mirror defining one end of the extended laser cavity. The passive locking arm 22 includes a passive resonator 24 for storing the circulating laser power from the diode 11, and an optical feedback path 26 for returning a portion of the energy in the passive resonator 24 back to the laser diode 11. The combination of the passive resonator 24 and the optical feedback path 26 can be viewed as a mirror with a frequency-dependent reflectivity, which forms the other end of the linear laser cavity.

Turning first to the spatial cleanup arm 18 in FIG. 1, the purpose of using the spatial filter 20 is to force the diode 11 to lase in a near-diffraction-limited mode. The use of a spatial filter for obtaining a near-diffraction-limited output has been described by a number of authors. For example, C. J. Chang-Hasnain et al. in "High Power and High Efficiency In a Narrow Single-Lobed Beam From a Diode Laser Array In An External Cavity," *Applied Phys. Lett.* 50, 1465 (1987) showed the use of a thin strip-mirror as the spatial filter. Goldberg et al. in "Diffraction-Limited Broad Stripe Laser Emission in an External Resonator," Digest of the Conference on Laser and Electro-Optics, (Optical Society of America, Washington D.C. 1989) Paper FL6, showed the use of a ninety (90) degree rooftop reflecting prism for the same purpose. In both cases, the portion of the beam corresponding to the diffraction-limited mode is reflected by the spatial filter back to the diode with relatively low losses while the losses experienced by the rest of the beam are high. By returning only the diffraction-limited portion of the beam back to the diode, the diffraction-limited emission from the diode is enhanced. The operation of a strip-mirror as a spatial filter will be illustrated in the embodiment in FIG. 2, while the ninety (90) degree rooftop reflecting prism is used in the embodiment in FIG. 3. In addition to the use of a spatial filter for beam cleanup, in both beam cleanup techniques of Chang-Hasnain et al. and Goldberg et al. the circulating laser power is incident on the diode facet at a small angle to the surface normal. The incident angle is typically between two (2) and five (5) degrees.

As shown in FIG. 1, the circulating laser power in the linear cavity travels between the two arms 18, 22 through the laser diode 11. The circulating power from each of the arms 18, 22 enters the diode 11 through the front facet 12. The highly reflective back facet 14 of the laser diode 11 reflects the circulating power back from one arm through the front facet 12 into the other arm. At the front facet 12, the path 19 of the circulating power in the beam cleanup arm 18 and the path 23 in the passive-locking arm 22 are symmetrically displaced from the surface normal 16 of the front facet 14 by an angle alpha ranging from two (2) to five (5) degrees, depending on the type of laser diode used.

Turning now to the passive locking arm 22, the passive resonator 24 stores or concentrates the output from the diode 11 as intracavity field which may be used for purposes such as non-linear light generation or Raman spectroscopy. The passive resonator 24 can be a ring or linear resonator. The output from the large-area laser diode 11 is mode-matched to the passive resonator 24, and a portion of the intracavity field in the passive resonator is returned to the diode through the feedback path 26. Effective frequency locking requires that the feedback level be sufficiently high in order to force the semiconductor laser diode 11 to lase in a single frequency mode. The large-area laser diode 11 will then adjust its output frequency $f_O$ to maximize the feedback from the passive resonator 24, thereby locking its frequency to a resonant frequency $f_R$ of the passive resonator 24. By maintaining sufficient feedback power over all changes in ambient conditions, effective frequency locking is ensured. The feedback level also affects the spatial mode structure of the diode 11 and, up to some level, acts to increase the diffraction-limited output power of the diode.

Appropriate optics and cavity architectures are provided so that the feedback path of the power from the passive resonator to the diode does not reenter the passive resonator. This avoids losses caused by passing the feedback power through the passive resonator, thereby allowing more power to be fed back to the gain element. For the laser diode in FIG. 1, which may be either a broad area diode of a phased-array diode, the typical feedback level is between 20 percent and 30 percent.

Due to the material properties of semiconductor laser diodes, it may be disadvantageous to feed too much power from the passive resonator back to the laser diode. Above a certain feedback level, the feedback power can cause a small scale self-focusing effect in the active area of the laser diode. The small scale self-focusing effect, also known as "filamenting," reduces the amount of diffraction-limited output of the laser diode and thereby adversely affects the mode-matching between the laser diode and the passive resonator. The small scale self-focusing effect thus sets a natural upper limit on the level of feedback power. This upper limit depends on the structure of the semiconductor device used. For a broad-area laser diode, the upper limit on the feedback level may be around 30 percent. For a tapered amplifier, due to the small dimension at the small end of its active area, a feedback level of five (5) percent may be enough to cause filamenting.

Figure 2:
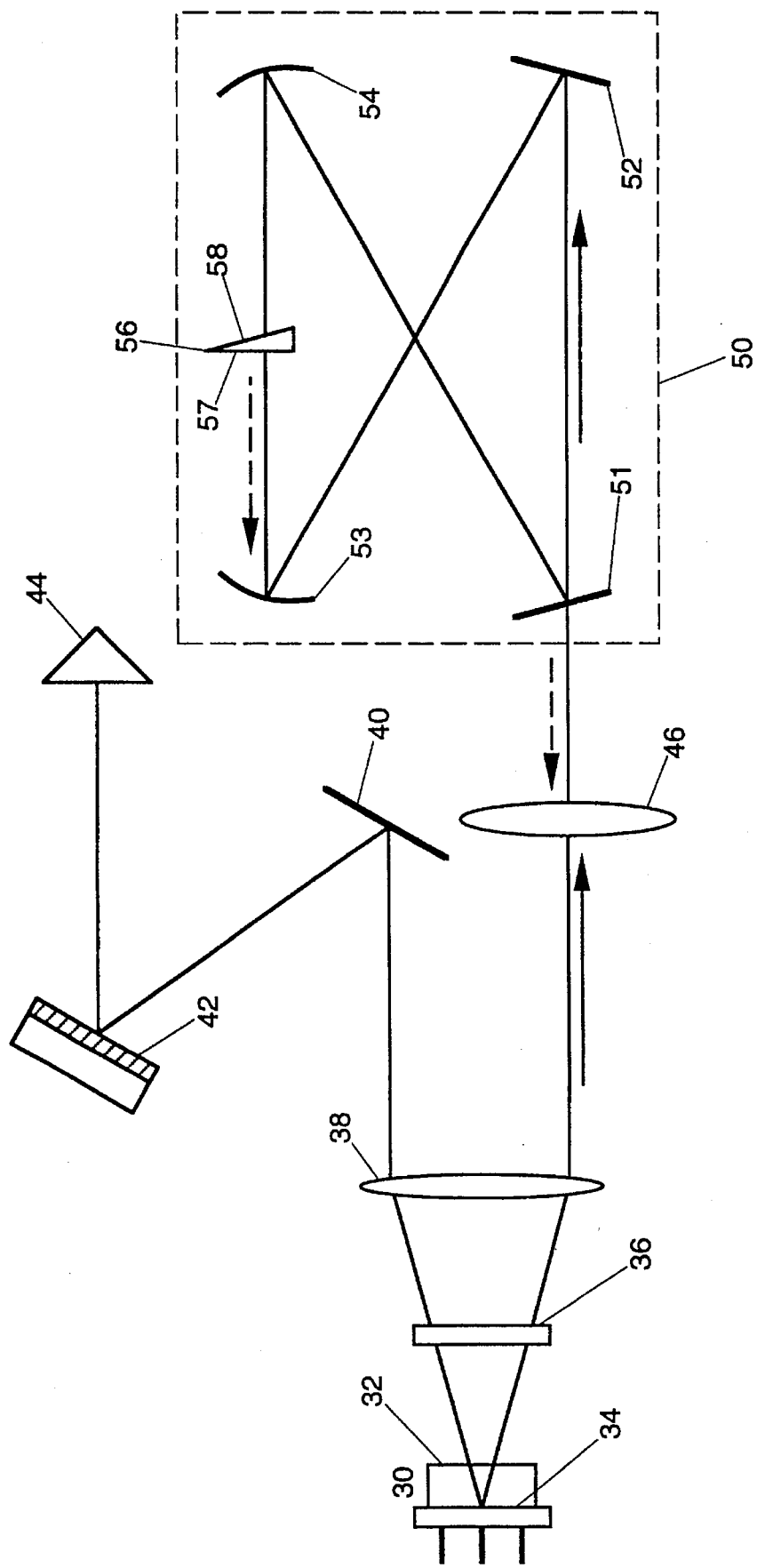
FIG. 2 is an illustration of an embodiment of the laser according to the invention that utilizes the linear cavity architecture of FIG. 1 and a passive ring resonator.

FIG. 2 is a schematic illustration of an embodiment of the solid state laser according to the present invention that utilizes the linear cavity architecture of FIG. 1. The diode 30 in FIG. 2 is either a broad area diode or a phased array diode, with the diode junction in a plane parallel to the paper. The front facet 32 of the laser diode 30 is anti-reflection (AR) coated. The back facet 34 of the diode is coated for high reflectivity at the laser frequency. Because the output of the diode 30 is rapidly divergent in the plane perpendicular to the junction, a lens 36 having a short focal length and a high numerical aperture is used to focus the output of the diode 30. In the direction parallel to the junction, a cylindrical lens 38 of longer focal length (typically greater than 50 mm) is used to collimate the diode output.

A high-reflectivity pick-off mirror 40 is used to divide the beam in the direction parallel to the junction of the diode 30. About one-half of the beam is reflected by the mirror 40 to a spatial filter 44 through a grating 42. The spatial filter 44 in FIG. 2 is a ninety (90) degree reflecting prism as described in the Goldberg reference. The diffraction-limited portion of the beam from the diode is focused onto the vertex of the prism 44. The prism 44 laterally displaces all rays that were not incident on the vertex of the prism, and returns only the portion of the beam corresponding to the diffraction-limited mode back to the diode 30 with relatively low losses. The spatial filter 44 thus forces the diode emission in a near-diffraction-limited mode. Optionally, an aperture (not shown) can be placed between the diode 30 and the grating 42 to prevent laser light outside of the near-diffraction-limited mode from being reflected back to the diode laser by the spatial filter. The grating 42 serves the function of wavelength selection. In the preferred embodiment, the grating 42 has 1200 line/mm.

The passive resonator 50 in FIG. 2 is a ring cavity defined by two flat mirrors 51, 52, and two curved mirrors 53, 54. A cylindrical lens 46 is used to mode-match the near-diffraction-limited output of the diode 30 to the fundamental spatial mode of the passive ring resonator 50. The resonator design and spacing between the short-focal-length cylindrical lens 36 and the ring resonator 50 is chosen to mode-match the diode output to the $TEM_{00}$ mode of the resonator 50 in the direction perpendicular to the diode junction.

In the preferred embodiment, the transmission of the input mirror 51 of the ring resonator 50 is impedance matched to the resonator cavity, i.e. the transmission of the mirror 51 is equal to the sum of other round trip losses of the resonator cavity. The losses in the passive resonator 50 can be caused by absorption, scattering, non-linear losses, and transmission of other optical elements in the resonator. The other resonator mirrors 52–54 are highly reflective at the diode wavelength.

A portion of the intracavity power in the ring resonator 50 is fed back to the diode 30 by placing a reflective surface 57 at one of the waist of the intracavity field in the ring resonator 50. In the preferred embodiment as shown in FIG. 2, the reflective surface 57 is an uncoated surface of a fused silica wedge 56. The other side 58 of the wedge 57 is AR-coated at the diode wavelength to minimize losses to the intracavity field. On resonance, reflection from the reflective surface 57 seeds the counter-propagating mode in the ring resonator 50. A portion of the counter-propagating mode is transmitted by the input mirror 51 and is imaged back by the lenses 46, 38, and 36 to the diode 30. By using the same set of lenses 46, 38, 36 for mode-matching the diode output to the passive resonator and for imaging the feedback power onto the diode, the number of parts and cost of the laser is minimized.

Figure 3:
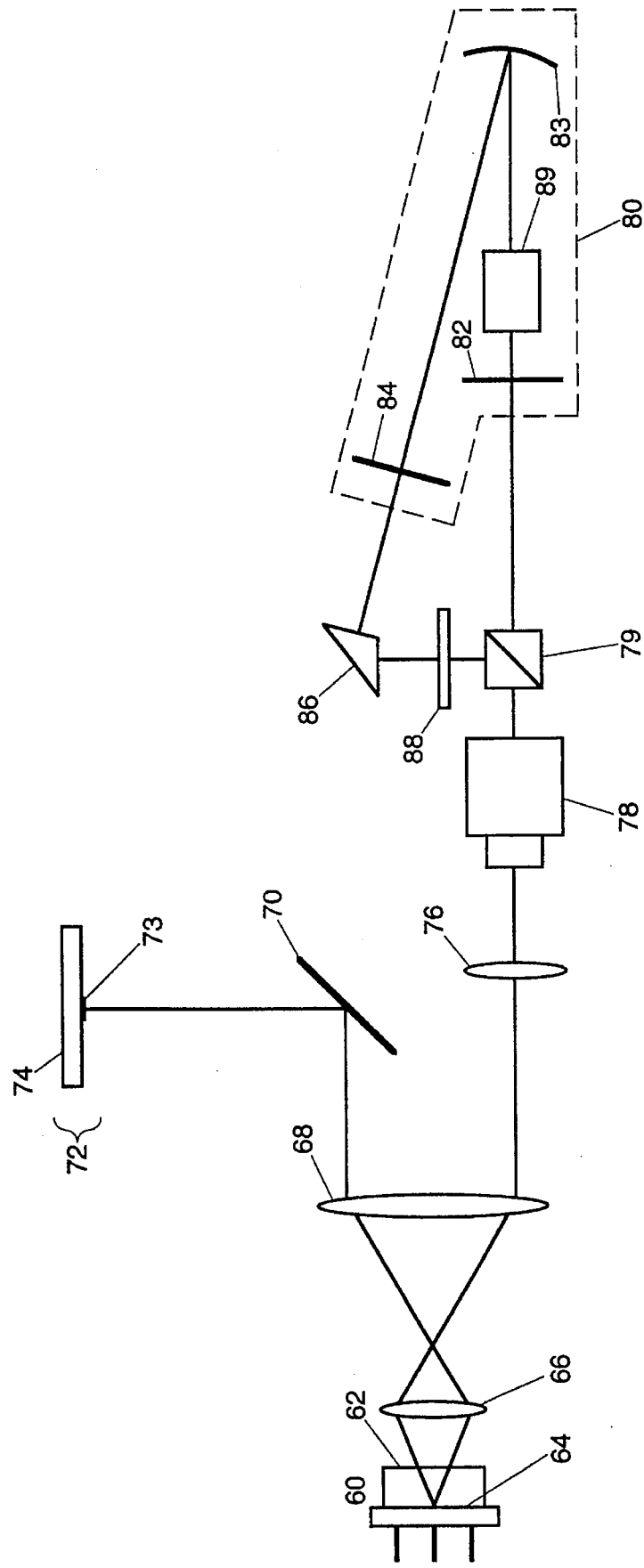
FIG. 3 is an illustration of an alternative embodiment of a solid-state laser according to the invention that incorporates the linear cavity architecture of FIG. 1 and a linear passive resonator.

FIG. 3 is an illustration of an alternative embodiment of a large-area diode laser according to the invention that incorporates the linear cavity architecture of FIG. 1 and a linear passive resonator. The junction of the diode 60 in FIG. 3 is in a plane parallel to the paper. A spherical lens 66 with a short focal length is used to focus the diode output in the direction perpendicular to the diode junction onto the spatial filter 72 and onto the flat input mirror 82 of the passive resonator 80, both of which are located at the same optical distance from the spherical mirror 66. A cylindrical lens 68 is used to collimate the beam in the direction parallel to the junction.

The spatial filter 72 in FIG. 3 is a "mirror" consisting a thin reflective gold stripe 73 on a flat high-transmission substrate 74, which is the type of spatial cleanup filter used in the Chang-Hasnain reference. The stripe 73 is oriented in the direction perpendicular to the diode junction and is positioned such that a diffraction-limited beam emerging from the diode 60 at an angle of two (2) degree to five (5) degrees to the surface normal of the front facet 62 is imaged onto the stripe 73. The exact angle will vary depending on the specific diode structure that is used. The width of the stripe 73 is chosen so that the diffraction-limited portion of the beam experiences relative high reflectivity (greater than 75 percent) while higher order modes are transmitted through the mirror. By returning only the diffraction-limited portion of the beam back to the diode 60, the diffraction-limited emission from the diode is enhanced.

In the passive-locking arm of the laser cavity, a spherical lens 76 is used to spatially mode-match the near-diffraction-limited output from the diode 60 to the fundamental transverse mode of the passive resonator 80 in the direction parallel to the diode junction. To block the light that is back-reflected from the input mirror 82 of the linear passive resonator 80, a Faraday isolator 78 is placed between the spherical lens 76 and the input mirror 82. Such an unidirectional device, which is often called an optical diode, is not needed in the embodiment in FIG. 2 because back-reflection from the input mirror 51 of the ring resonator 50 is not directed back to the diode 30.

In FIG. 3, light that is transmitted by the passive resonator 80 is fed back to the laser diode 60 for locking the frequency $f_O$ of the optical radiations from the laser diode to the resonant frequency $f_R$ of the passive resonator. The complete feedback path includes a reflective prism 86, a halfwave plate 88, a beam splitter 79, the Faraday isolator 78, and the mode-matching and focusing lenses 76, 68, and 66. The halfwave plate 88 rotates the polarization of the feedback light by 90 degree so that it will pass through the Faraday isolator 78. The reflective prism 86 is a diffractive length compensator for the purpose of equalizing the diffractive path length between the beam-splitter 79 and the output mirror 86 to the diffractive path length between the beam-splitter 79 and the input mirror 82. By equalizing the path lengths, the light transmitted by the passive resonator 80 can be imaged onto the diode 60 by the same set of lenses 66, 68 and 76 used to mode-match the diode output to the passive resonator 80.

The transmission of input mirror 82 in FIG. 3 is chosen to match the losses in the resonator cavity 80. The transmission of the input mirror 82 is typically around five (5) percent. The transmission of the output mirror 84 is typically between three (3) and five (5) percent. FIG. 3 also shows an optional birefringent filter 89 placed in the passive resonator for wavelength selection.

Figure 4:
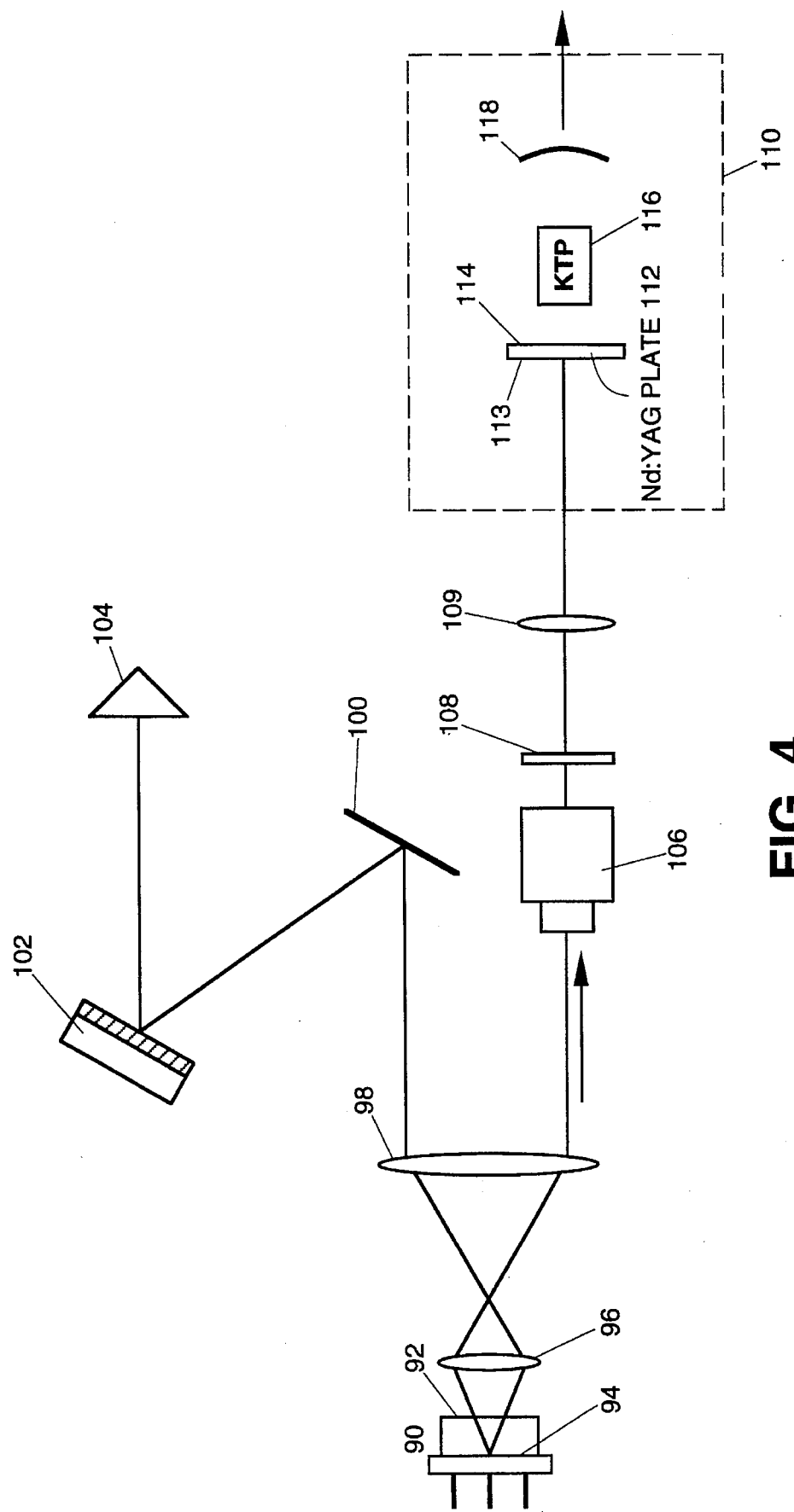
FIG. 4 is an illustration of a second alternative embodiment that incorporates the linear cavity architecture of FIG. 1 and a linear passive resonator with a non-linear crystal therein for the purpose of realizing a sum frequency output.

FIG. 4 is an illustration of an alternative embodiment that incorporates the linear cavity architecture and a linear passive resonator with a non-linear crystal therein for the purpose of realizing a sum frequency output. In this embodiment the diode 90 is broad-area diode with an output wavelength near 810 nm. The front facet 92 of the broad-area diode 90 is AR-coated at 810 nm, while the back facet 94 is highly reflective at the same wavelength. The spatial filter 104 is a 90 degree rooftop reflecting prism like the one illustrated in FIG. 2.

In FIG. 4 the output of the diode 90 is used to resonantly pump a Nd:YAG based sum-frequency laser. The passive resonator 110 contains a 0.5 mm plate 112 of 0.2 percent-doped Nd:YAG crystal and a spherical output mirror 118. A KTP crystal 116 is placed in the passive resonator 110 for the non-linear process of frequency summing. The input facet 113 of the Nd:YAG crystal 112 is coated for high reflectivity at 1064 nm and approximately 5 percent transmission at 810 nm. The intracavity surface 114 of the Nd:YAG plate 112 and the two surfaces of the KTP crystal 116 are AR-coated at both 810 nm and 1064 nm. The output mirror 118 is coated for high reflectivity at 810 nm and 1064 nm, and high transmission at 459 nm. The output mirror 118 and the input facet 113 of the Nd:YAG crystal 112 thus define a passive cavity for the 810 nm light, while at the same time form the laser cavity for the 1064 nm light generated by the Nd:YAG crystal 112.

A collimating lens 96 with a short focal length is used to focus the diode output in the direction perpendicular to the diode junction onto both the spatial filter 104 and the input mirror 113 of the passive resonator. A cylindrical lens 98 is used to collimate the beam in the direction parallel to the junction. A half-silvered mirror 100 is used to split the beam into two equal halves. One half of the beam is reflected to the spatial filter 104 through a grating 102. The grating 102 as a wavelength selector forces the diode to lase at a wavelength that is well absorbed by the Nd:YAG plate 112. The second half of the diode output is passed through a Faraday isolator 106 with its output polarizer removed and a halfwave plate 108 before it is focused in the direction parallel to the diode junction to the Nd:YAG plate 112 by a cylindrical lens 109.

In operation, the polarization of the input beam of the passive resonator 110 is adjusted with the halfwave plate 108 so that it does not correspond to either of the crystallographic axes of the KTP crystal 116. When the input beam is not resonant with either polarization of the passive resonator 110, the light reflected by the passive resonator has the same polarization as the input beam and is attenuated by the Faraday isolator 106. When either of the polarizations is resonant, the reflected light contains polarization components that are orthogonal to the input beam. Those components are transmitted through the Faraday isolator 106 without attenuation, and are imaged back onto the laser diode 90 for locking the frequency of the diode to the cavity. Inside the cavity the KTP crystal 116 combines the 1064 nm light generated by the Nd:YAG plate 112 and the intracavity field of 810 nm in the resonator 110 to form 459 nm light, which is transmitted through the output mirror 118.

Figure 6:
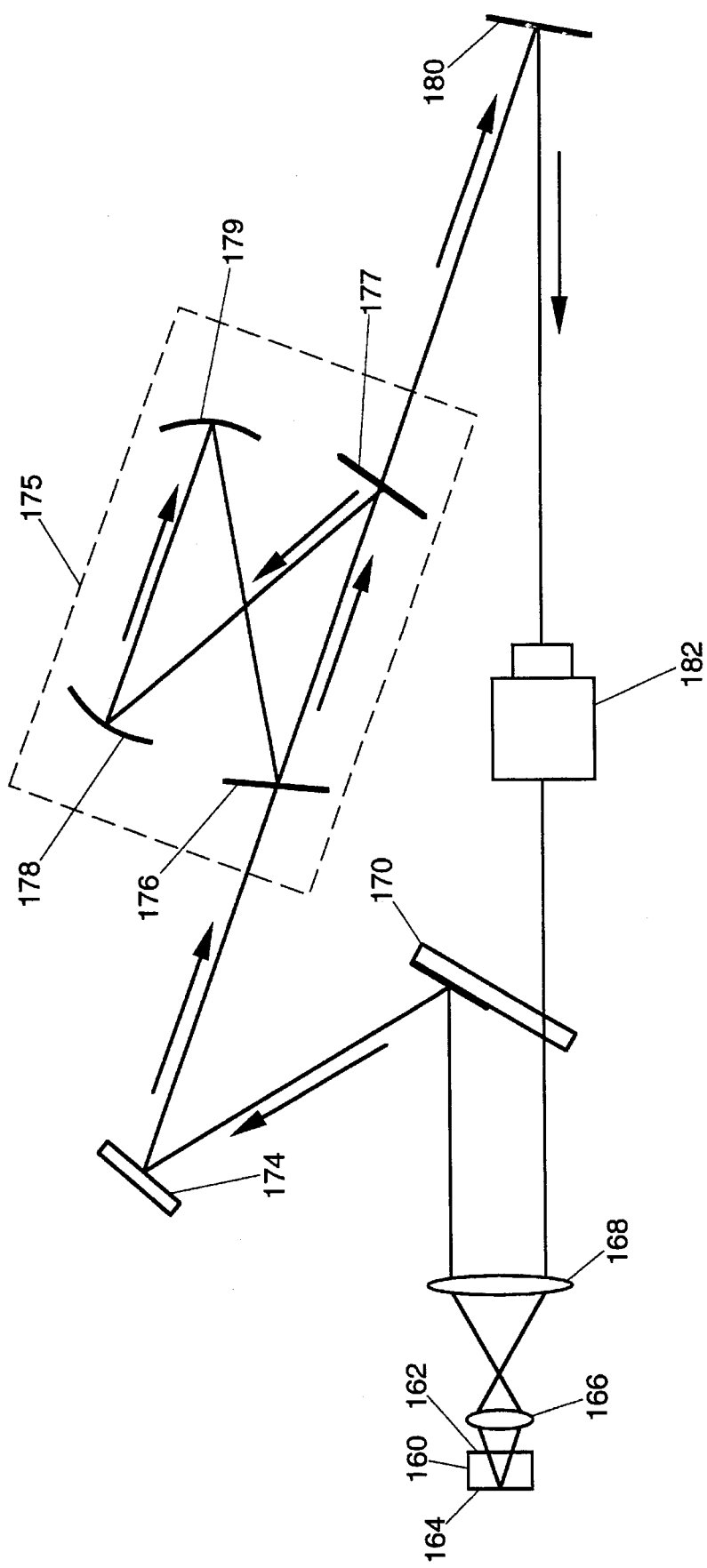
FIG. 6 is a schematic illustration of a particular embodiment of a solid-state laser according to the invention that incorporates the extended ring cavity architecture generally illustrated in FIG. 5 and a passive ring resonator.
Figure 7:
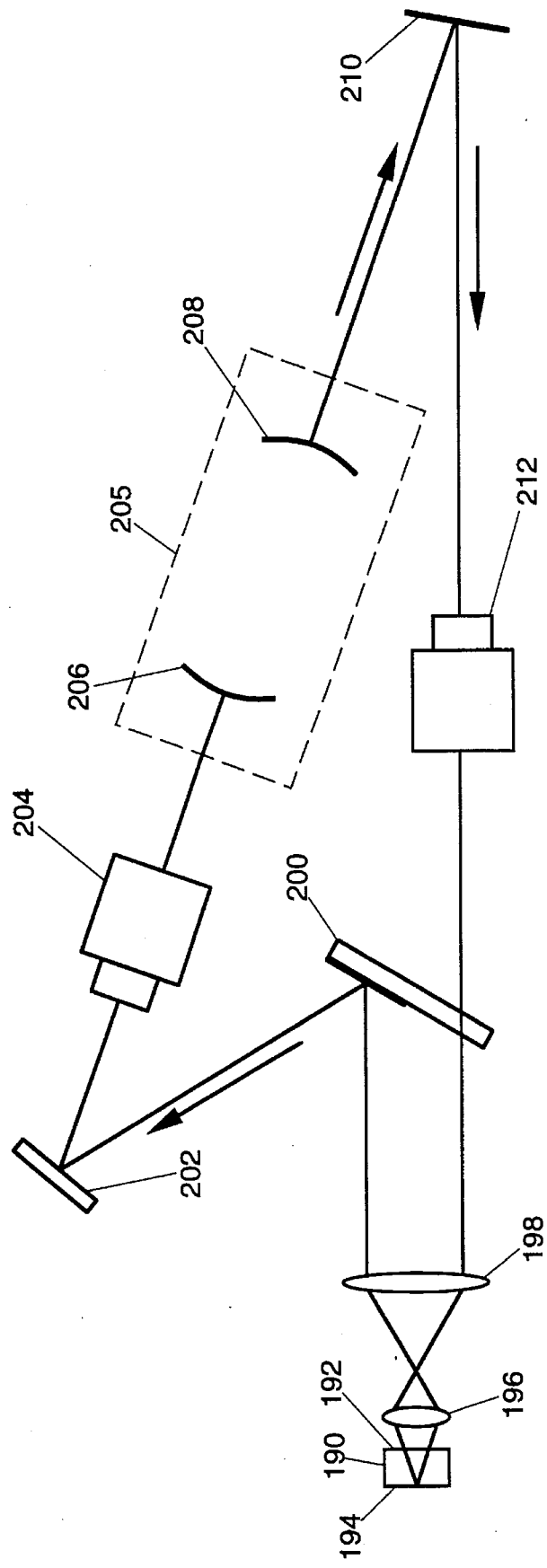
FIG. 7 is an illustration of an alternative embodiment of a solid-state laser according to the invention that employs the extended ring cavity architecture generally illustrated in FIG. 5 and a linear passive resonator.
Figure 8:
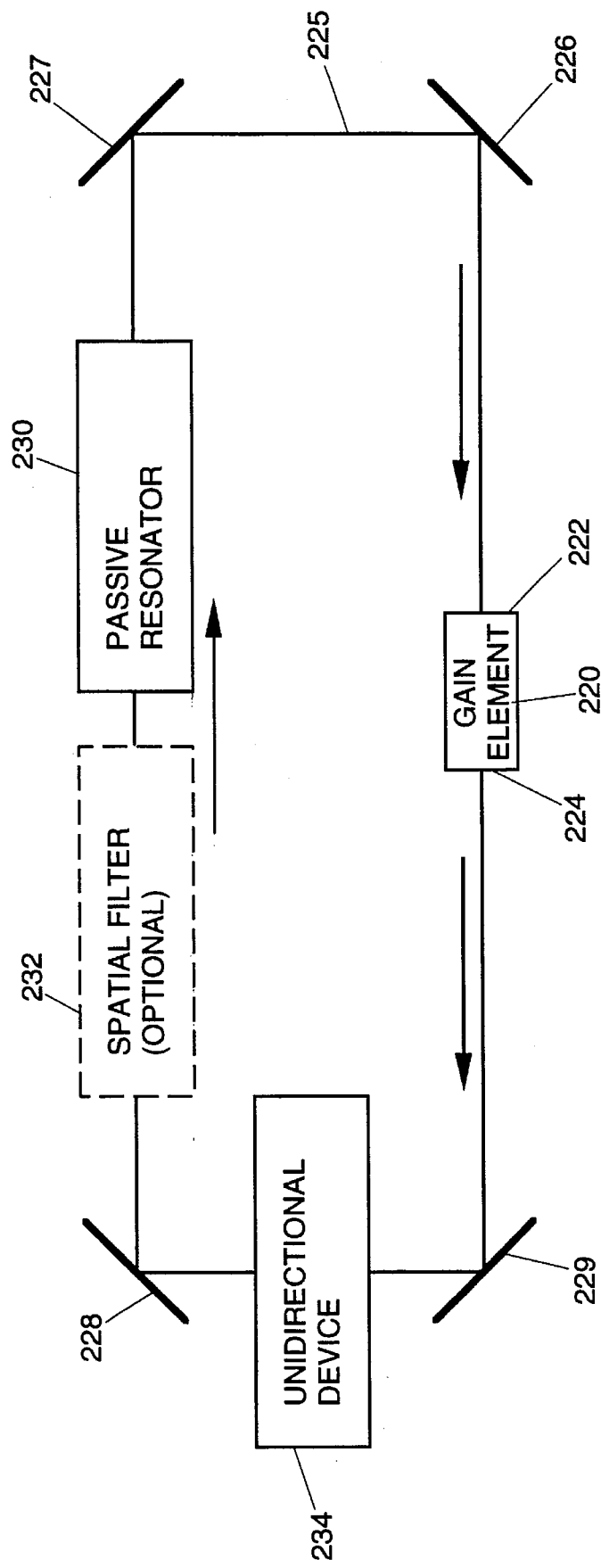
FIG. 8 is a highly schematic illustration of a solid-state laser according to the invention wherein the extended laser cavity is a ring cavity, and the circulating laser field passes through the laser diode once in a round trip through the ring cavity.
Figure 9:
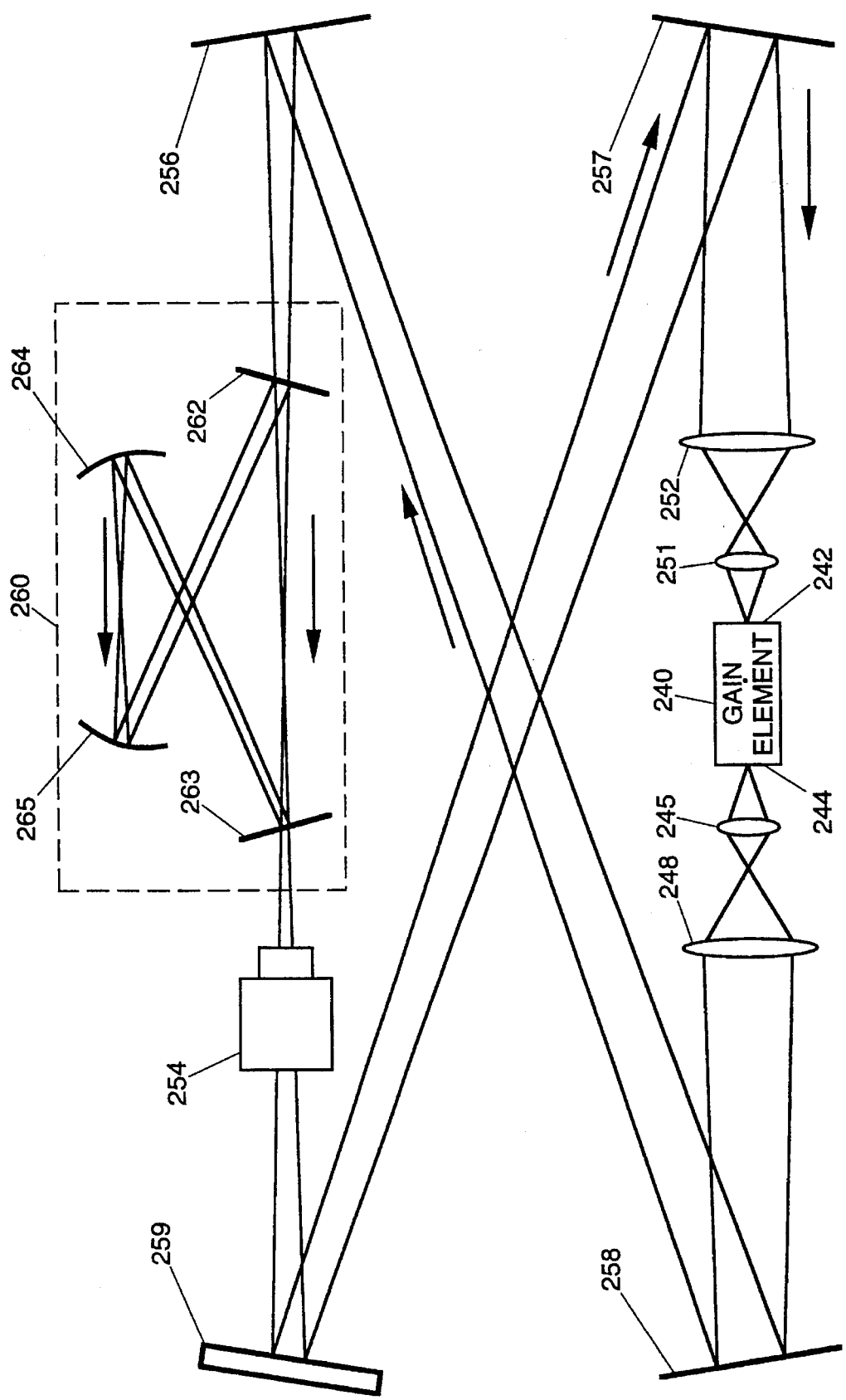
FIG. 9 is an illustration of a solid-state laser according to a particular embodiment that incorporates the ring cavity architecture illustrated in FIG. 8.
Figure 10:
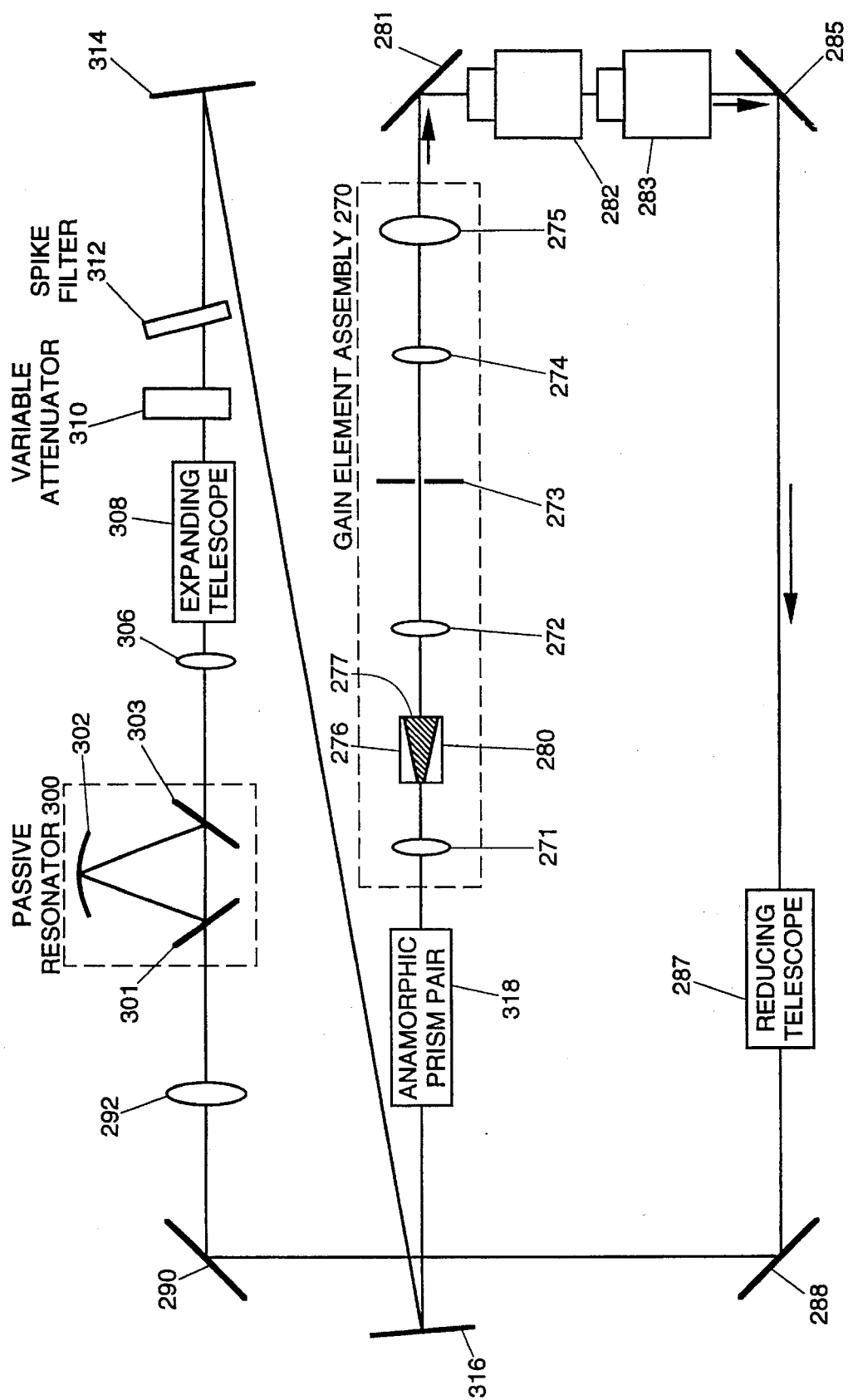
FIG. 10 is an illustration of an embodiment of a solid-state laser that employs the ring cavity architecture illustrated in FIG. 8 and has a tapered amplifier as the gain element.

In contrast to the linear cavity architecture employed in FIGS. 1–4, the embodiments illustrated in FIGS. 5–10 employ a ring cavity architecture with the techniques according to the present invention for passively locking the frequency $f_O$ of a large-area laser diode to a resonant frequency $f_R$ of a passive resonator. Two types of ring cavity architectures are illustrated. In the first type, illustrated in FIGS. 5–7, the circulating laser power in the ring cavity enters and exits the large-area diode through the same facet. Because the circulating field passes through the diode twice in each round trip through the ring cavity, a laser with this type of laser cavity architecture is hereafter called a double-pass ring laser. A laser of the second type of architecture, illustrated in FIGS. 8–10, is called a single-pass ring laser because the circulating laser field in each round trip passes the diode once, entering the diode through one facet and leaving through the other facet.

Figure 5:
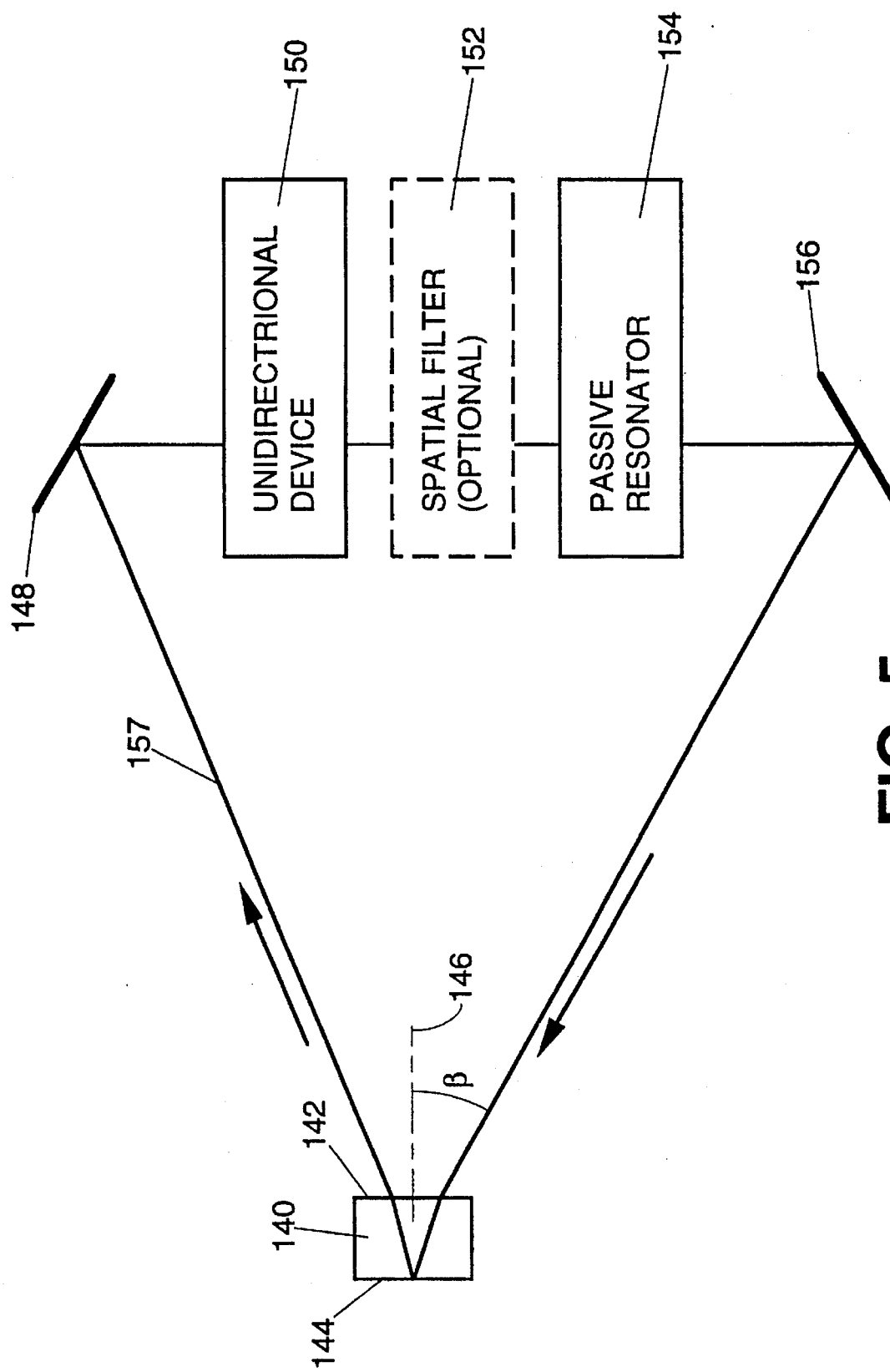
FIG. 5 is a highly schematic diagram of a solid-state laser according to the invention that utilizes an architecture wherein the extended laser cavity is a ring cavity and the circulating laser field enters and exits the laser diode through the same facet.

FIG. 5 is a highly schematic diagram of a solid-state laser according to the invention that utilizes the double-pass ring cavity architecture. The laser diode 140 is a large-area non-taper diode, such as a broad-area or a phased-array diode. The back facet 144 of the laser diode 140 is coated for high reflectivity at the laser frequency. The front facet 142 is AR-coated at the laser frequency to minimize reflection. The extended laser ring cavity is defined by the back facet 144 and high-reflectivity mirrors 148, 156. The circulating field in the cavity is forced to travel along the path 157 in one direction by a unidirectional device 150. A passive resonator 154 is positioned in the path of the circulating field in the ring cavity. Light transmitted through the passive resonator 154 is fed back to the laser diode 140, thereby locking the frequency $f_O$ of the diode 140 to a resonant frequency $f_R$ of the passive resonator 154.

As shown in FIG. 5, the circulating power enters the front facet 142 of the diode 140 at a small angle β off the surface normal 146. The circulating field is reflected back by the back facet 144 and exits the diode 140 through the front facet 142, at an angle from the surface normal equal to the incident angle β. The angle β ranges from two (2) to five (5) degrees, depending on the particular diode structure. This angle is essential to obtaining a single-mode output from the laser diode 140. This configuration of off-normal incidence for beam cleanup is described in U.S. Pat. No. 4,905,252 to Goldberg et al.

FIG. 5 also shows a spatial filter 152 for controlling the spatial mode of the beam in the ring laser cavity. The spatial filter 152 is shown in broken line to indicate that it is optional. A spatial filter is optional because according to the present invention a properly designed resonator cavity can act as both a spatial filter and a spectral filter. If the cavity of the passive resonator 154 is non-degenerate, its different resonant transverse modes will have different frequencies. As a result, it is possible to mode-match the diode output to only one of the transverse modes at a time. If the overlap between the circulating laser field and the fundamental mode of the resonator 154 is higher than the overlap with other high order modes of the resonator, the laser field will be locked to the fundamental mode. In this fashion, the passive cavity can spatially filter the spatial mode of the circulating laser field.

Wavelength selection in this architecture is also optional. Wavelength selection can be achieved in several ways. For example, one of the high-reflectivity mirrors 148, 156 can be replaced by a grating with typically 1200 lines/mm for wavelength selection. The preferred method for wavelength selection is to use a birefringent filter (not shown in FIG. 5) placed inside the passive resonator as the wavelength selector. Birefringent filters are characterized by low transmission losses which are typically one order of magnitude smaller than the loss of a diffraction grating. Their low transmission losses allow more light from the resonator to be fed back to the diode. Because the out-of-band losses of a birefringent filter is often not as high as those of a grating, a birefringent filter may not be an effective wavelength selector if used outside the resonator cavity. By placing the filter inside the resonator, however, the effectiveness of out-of-band rejection is increased because the intracavity field in the resonator passes through the filter multiple times.

FIG. 6 is a schematic illustration of a particular embodiment of a solid-state laser according to the invention that incorporates the double-pass extended ring cavity architecture generally illustrated in FIG. 5. The front facet 162 of the diode 160 is AR-coated, and the back facet 164 is coated for high reflectivity. A Faraday isolator 182 is used as the unidirectional device for forcing the circulating laser field to circulate in one direction. The passive resonator 175 is a ring cavity defined by two flat mirrors 176,177 and two concave mirrors 178, 179.

A well-corrected collimating spherical lens 166 is used to focus the output of the diode 160 in the direction perpendicular to the diode junction to a waist that is coincident with the waist of the passive ring resonator 175. In the direction parallel to the diode junction, this lens will form an image at a short distance behind the lens and the light will diverge from that point. A cylindrical lens is therefore used to focus the beam in this direction at a point coincident with the waist of the passive ring resonator 175. A half-silvered mirror 170 located behind the cylindrical lens 168, directs a fraction (typically close to 50 percent) of the beam to a highly reflective flat mirror 174 while the remaining portion of the beam passes through the half-silvered mirror 170 and is attenuated by the unidirectional device 182.

The passive ring resonator 175 is designed so that the large waist of its resonant mode located between the two flat mirrors 176,177 coincides with the waist formed by the lenses 166 and 168 and is approximately the same size. The extended laser cavity formed by the mirrors 170, 174 and 180 is aligned in such a way that the light passing through the passive resonator 175 is imaged back onto the front facet 162 of the diode 160 at the correct incident angle to maximize the diffraction-limited output power from the device.

It is preferred that the input mirror 176 of the passive resonator 175 has a transmission that is impedance matched to the sum of other losses in the resonator cavity. Wavelength selection, which is optional in the embodiment of FIG. 6, may be accomplished by replacing one of the flat mirrors 174, 180 with a grating typically having a groove density of 1200/mm and a diffraction efficiency greater than 60 percent at the wave length of interest. Alternatively, wavelength selection can be done by placing a birefringent filter in the passive ring resonator 175.

FIG. 7 shows schematically an embodiment which is very similar to that in FIG. 6, but with a linear passive resonator 205. In this case, light from the diode 190 can be directly reflected by the input mirror 206 of the linear resonator 205 back to the diode if it is not blocked. In order for the ring laser to operate unidirectionally, two optical isolators 204 and 212 placed on the opposite sides of the resonator cavity 205 are required to force the circulating laser field to move in one direction.

FIG. 8 is a highly simplified schematic illustration of a large-area laser diode with a single-pass ring cavity architecture which is passively locked to a resonant frequency $f_R$ of a passive resonator. The laser has a ring cavity defined by four mirrors 226 through 229. The circulating laser field in the ring laser cavity is forced to travel along the path 225 in one direction by a unidirectional device 234. The circulating laser field enters the laser diode 220 through the input facet 222 and exits through the output facet 224. The output from the laser diode 220 is introduced into a passive resonator 230 positioned in the path of the circulating laser field. The light transmitted by the passive resonator 230 is fed back to the laser diode 220 for locking.

Both facets 222 and 224 of the laser diode 220 are AR-coated to minimize reflection. An alternative method for reducing the effects of reflection from the facets 222 and 224 is to fabricate the laser diode 220 in such a way that the facets 222 and 224 are not perpendicular to the transmission axis of the laser diode. Thus the lights reflected off the facets are not in the direction of the circulating laser field.

Like the double-pass ring architecture in FIG. 5, wavelength selection in the single-pass ring architecture illustrated in FIG. 8 is optional. It can be achieved, for example, by replacing one of the mirrors 226 through 229 with a grating (not shown), or by positioning a birefringent filter (not shown) inside the passive resonator 230. FIG. 8 also shows an optional spatial filter 232 for beam cleanup.

The single-pass ring architecture in FIG. 8 has an important advantage over the double-pass architecture as shown in FIG. 5. In the double-pass configuration the laser field enters and exits the diode through the same facet. Even though there is a small angle separating the input and output beams, interference between the two beams occurs, leading to the effect commonly called "spatial hole burning." Spatial hole burning produces an index grating within the active medium, scattering light out of the input beam and reducing the power that can be obtained from the laser diode in a diffraction-limited mode. In the single-pass ring configuration the circulating laser power passes through the large-area diode with AR-coated facets in only one direction, and therefore does not exhibit the spatial hole burning effect. A large-area diode laser in the single-pass configuration may therefore produce higher diffraction-limited output power.

FIG. 9 illustrates schematically an embodiment of the single-pass ring laser architecture of FIG. 8. The laser ring cavity is formed with the high-reflectivity mirrors 256–258, and a grating 259. The unidirectional device 254 is a combination of a Faraday rotator and a halfwave plate. The passive resonator 260 is formed with two flat mirrors 262, 263, and two concave mirrors 264, 265. A collimating lens 245 and a cylindrical lens 248 are positioned on the output side of the diode 240 to focus the diode output to a circular waist that is coincident with the waist of the passive ring resonator 260. The collimating lens 251 and cylindrical lens 252 on the input side of the diode 240 are for imaging the light transmitted by the passive resonator 260 back to the diode.

The transmission of the input mirror 262 of the passive resonator 260 is impedance matched to the losses in the resonator. The output mirror 263 has a transmission that allows a sufficient feedback level to the laser diode 240. The laser diode used in the single-pass ring architecture illustrated in FIGS. 8 and 9 can be a broad area laser diode, a phased array laser diode, or a laser diode with a tapered active region. The feedback level required for locking the laser diode to the passive resonator is typically 20 to 30 percent for a broad-area diode or a phased array, and two (2) to five (5) percent for a tapered amplifier.

In order to use a tapered diode as the gain element, different imaging optics would be used on the two sides of the tapered diode. Specifically, the optics needed to mode-match the light leaving the output facet of the tapered diode will be different from those needed to focus the light transmitted by the passive resonator to the input facet of the tapered diode.

FIG. 10 shows an embodiment of a laser with the single-pass ring architecture in FIG. 8 and with a tapered amplifier as the gain element. In an experimental set up employing the embodiment in FIG. 10, applicant used a gain element assembly 270 taken from a high-power tunable diode laser device available from SDL, Inc., 80 Rose Orchard Way, San Jose, Calif. 95134 (Cat. No. SDL-8630). This gain element assembly 270 includes a tapered amplifier 280 as the gain element as well as other optical elements 271 through 275. The wavelength of the light generated by the tapered amplifier 280 is around 845 nm. The optical elements 271 through 275 in the gain element assembly 270 are used for initial collimation and beam shaping of the light output of the tapered amplifier 280. The light leaving the large end 277 of the tapered amplifier 280 is collimated in the direction perpendicular to the diode junction of the tapered amplifier by a spherical lens 272 of a high numerical aperture (typically greater than 0.5). This lens 272 also focuses the output of the tapered amplifier 280 in the plane perpendicular to the diode junction at a slit 273 that may act as a spatial filter. The slit 273 has been included in the laser assembly 270, but is not necessary in the embodiment shown in FIG. 10 for the purpose of passive locking of the tapered amplifier 280. Two cylindrical lenses 274, 275 form a cylindrical telescope with power in the plane parallel to the junction which collimates the light that has passed through the slit 273.

In FIG. 10 the ring laser cavity is defined by the mirrors 281, 285, 288, 290, 314, and 316, all of which are highly reflective at the output wavelength of the tapered amplifier 280. Two Faraday isolators 281, 282 are used as unidirectional devices for forcing the laser light to travel in the ring laser cavity in only one direction. Those two Faraday isolators also provide protection of the tapered amplifier 280 from being damaged by the back-reflections from other optical elements. The Faraday isolators may be, for example, a NIR5, wavelength variable attenuator (manufactured by Optics for Research, Box 82, Caldwell, N.J. 07006). An 8:1 reducing telescope 287 is used for initial beam reduction before a mode-matching lens 292 images the circulating laser field into a passive resonator 300. The passive resonator 300 in FIG. 10 is a three-bounce ring cavity comprising three mirrors 301–303. The input mirror 301 has a transmission of 5 percent at 845 nm, and the output mirror 303 has a transmission of 3 percent. The mirror 302 is highly reflective at the same wavelength. The reflective values of the mirrors 301 through 303 are designed to match an intracavity loss of 2 percent while providing a maximum power transmission of the passive cavity 300 in excess of 50 percent.

The light transmitted through the passive resonator 300 is collimated by another mode-matching lens 306 before it is expanded by a telescope 308 with a magnification of approximately 8:1. A variable attenuator 310 is placed after the telescope 308. The variable attenuator 310 used in the embodiment in FIG. 10 is available from Melles-Griot, 1770 Kettering St., Irvine, Calif. 92714 (Cat. No. 03FDC003/D, Circular Linear-Wedge Neutral Density Filter). As described earlier, too much feedback power may cause small scale self-focusing in the semiconductor gain element. The attenuator 310 is used for adjusting the feedback amplitude to an optimal value which is not too high but is sufficient to passively lock the tapered amplifier 280 to the passive resonator 300.

A dielectric spike filter 312 with a pass band around 845 nm is used to constrain the wavelength bandwidth of the emission of the tapered amplifier 280. The filter 312 in the embodiment in FIG. 10 is special-ordered from Research Electro-optics in Boulder, Colo., and has a maximum transmission of 95 percent and a half-power bandwidth of approximately 1 nm. In operation, the combination of the transmission functions of the passive resonator 300 and the spike filter 312 forces the tapered amplifier 280 to lock its frequency to a resonance mode of the passive resonator 300 that lies close to the top of the transmission peak of the spike filter 312.

The light transmitted by the passive resonator 300 is fed back to the tapered amplifier 280 through the small end 276. An anamorphic prism pair 318 with a beam expansion ratio of approximately 3:1 is placed between the spike filter 312 and the small end 276 of the tapered amplifier 280. This prism pair 318, which is an optional component in the embodiment in FIG. 10, is available from Melles-Griot (Cat. No. 06-GPA004). It is used to better mode-match the throughput of the passive resonator 300 to the mode of the tapered amplifier 280.

All publications, patents, and patent applications cited herein are hereby incorporated by reference to the same extent as if each individual document was individually and specifically indicated to be incorporated by reference and was set forth in its entirety herein.

As will be appreciated by those skilled in the art of laser design, the embodiments of the invention illustrated in FIGS. 2–4, 6,7, 9, and 10 are only representative of particular embodiments employing the concepts of the invention to passively lock a large-area diode laser to a passive resonator. It is intended that the invention may be practiced otherwise than as specifically described herein. As will be appreciated by those of ordinary skill in the art, configurations of the extended laser cavity different from those illustrated herein may be used to achieve simultaneous beam cleanup and passive locking in accordance with the invention. High intracavity power in the passive resonator with satisfactory amplitude stability is thus obtainable, thereby enabling practical and efficient light generation in non-linear optical processes such as second harmonic generation, frequency mixing, and resonant pumping. Accordingly, this invention includes all modifications encompassed within the spirit and scope of the appended claims.

I claim as my invention:

1. A laser comprising in combination: a large-area, non-taper semiconductor gain element having front and back facets for generating optical radiation at a frequency $f_0$, the front and back facets being characterized by relatively low and high reflectivities, respectively; an extended linear cavity for forming circulating laser power from the optical radiation generated by the gain element, wherein the circulating laser power enters and exits the gain element through the front facet at predetermined angles from the surface normal; a spatial filter for forcing the gain element to emit optical radiation in a near-diffraction-limited beam; a passive resonator for concentrating the circulating laser power at a resonant frequency $f_R$ as resonator power inside the passive resonator; an optical coupling for introducing the optical radiation from the gain element into the passive resonator; and a feedback path for returning to the semiconductor gain element a portion of the resonator power in the passive resonator, the portion of the power returned to the semiconductor gain element being of sufficient magnitude to lock the frequency $f_0$ of the gain element to the resonant frequency $f_R$ of the passive resonator, such that $f_0$ and $f_R$ are substantially equal.

2. The laser as in claim 1, wherein the extended linear cavity comprises a beam cleanup arm which incorporates the spatial filter, and a passive locking arm which incorporates the passive resonator, and wherein the circulating laser power travels between the two arms via the gain element.

3. The laser as in claim 1, wherein the semiconductor gain element is a broad-area laser diode.

4. The laser as in claim 1, wherein the semiconductor gain element is a diode array.

5. The laser as in claim 1, wherein the passive resonator is a linear resonator.

6. The laser as in claim 5, wherein the optical coupling and the feedback path share at least a focusing element for both mode-matching the circulating laser power from the gain element to the passive resonator and mode-matching the feedback power from the passive resonator to the gain element, and the feedback path includes a diffractive length compensating element for equalizing the diffractive length from the passive resonator to the focusing element along the feedback path and the diffractive length from the focusing element to the passive resonator along the optical coupling.

7. The laser as in claim 1, wherein the passive resonator is a ring resonator.

8. The laser as in claim 7, wherein the feedback path includes a surface placed in the passive ring resonator for reflecting a portion of the resonator power as the feedback power back to the gain element.

9. The laser as in claim 1, including a birefringent filter positioned in the passive resonator for wavelength selection.

10. A laser comprising in combination: a large-area, non-taper semiconductor gain element having front and back facets for generating optical radiation at a frequency $f_0$, the front and back facets being characterized by relatively low and high reflectivities, respectively; an extended ring cavity for forming circulating laser power from the optical radiation at the frequency $f_0$ generated by the gain element, which circulates along a circulation path through the extended ring cavity; a unidirectional device for forcing the circulating laser power to travel along the circulation path in only one direction, the circulating laser power entering the gain element through the front facet at an incident angle from the surface normal and exiting the gain element through the front facet at an exit angle from the surface normal, the incident angle and exit angle being approximately equal; a passive resonator positioned in the circulation path for concentrating the circulating laser power inside the passive resonator; an optical coupling in the circulation path for introducing the circulating laser power from the gain element into the passive resonator; and means for transmitting a portion of the concentrated power along the circulation path to the semiconductor gain element, the transmitted portion of the concentrated power being of sufficient magnitude to lock the frequency $f_0$ of the gain element to a resonant frequency $f_R$ of the passive resonator, such that the frequencies $f_0$ and $f_R$ are substantially equal.

11. The laser as in claim 10, wherein the means is an output mirror of the passive resonator.

12. The laser as in claim 10, wherein the incident angle of the circulating laser power on the front facet of the gain element is in the range of two to five degrees.

13. The laser as in claim 10, wherein the semiconductor gain element is a broad-area laser diode.

14. The laser as in claim 10, wherein the semiconductor gain element is a phased array diode.

15. The laser as in claim 10, including a birefringent filter positioned in the passive resonator for wavelength selection.

16. The laser as in claim 10 wherein a spatial filter is placed in the extended ring cavity for enhancing the spatial mode matching to the passive resonator.

17. A laser comprising in combination: a large-area semiconductor gain element having first and second facets for generating optical radiation at a frequency $f_0$, where both the first and second facets are characterized by relatively low reflectivity at the frequency $f_0$ of the optical radiation; an extended ring cavity for forming circulating laser power from the optical radiation generated by the gain element, which circulates along a circulation path through the extended ring cavity; a unidirectional device in the circulation path for forcing the circulating laser power to travel through the ring cavity in only one direction, where the circulating power enters the gain element through the first facet and leaves the gain element through the second facet; a passive resonator positioned in the circulation path for concentrating the circulating laser power inside the passive resonator; an optical coupling in the circulation path for introducing the circulating laser power from the gain element into the passive resonator; and, means for transmitting a portion of the concentrated power along the circulation path to the semiconductor gain element, the transmitted portion of the concentrated power being of sufficient magnitude to lock the frequency $f_0$ of the gain element to a resonant frequency $f_R$ of the passive resonator, such that the frequencies $f_0$ and $f_R$ are substantially equal.

18. The laser as in claim 17, wherein the means is an output mirror of the passive resonator.

19. The laser as in claim 17, wherein the semiconductor gain element is a broad-area laser diode.

20. The laser as in claim 17, wherein the semiconductor gain element is a phased array diode.

21. The laser as in claim 17, wherein the semiconductor gain element has a tapered gain region.

22. The laser as in claim 17, wherein the first and second facets of the semiconductor gain element are anti-reflection coated.

23. The laser as in claim 17, wherein the first and second facets of the semiconductor gain element are not perpendicular to the path of the circulating laser power passing through the gain element.

24. The laser as in claim 17, wherein the passive resonator is a ring resonator.

25. The laser a sin claim 17, wherein a spatial filter is placed in the extended ring cavity for enhancing the spatial mode matching to the passive resonator.

\* \* \* \* \*